(12) United States Patent
Chandrasekharan et al.

(10) Patent No.: US 9,631,276 B2
(45) Date of Patent: Apr. 25, 2017

(54) SYSTEMS AND METHODS ENABLING LOW DEFECT PROCESSING VIA CONTROLLED SEPARATION AND DELIVERY OF CHEMICALS DURING ATOMIC LAYER DEPOSITION (71) Applicant: LAM RESEARCH CORPORATION, Fremont, CA (US)

(72) Inventors: Ramesh Chandrasekharan, Portland, OR (US); Jennifer O'Loughlin, Portland, OR (US); Saangrut Sangplung, Sherwood, OR (US); Shankar Swaminathan, Beaverton, OR (US); Frank Pasquale, Tualatin, OR (US); Chloe Baldasseroni, Portland, OR (US); Adrien LaVoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/805,852

(22) Filed: Jul. 22, 2015

(65) Prior Publication Data
US 2017/0016115 A1 Jan. 19, 2017

Related U.S. Application Data (60) Provisional application No. 62/192,844, filed on Jul. 15, 2015.

(51) Int. Cl.
C23C 16/455 (2006.01)
C23C 16/50 (2006.01)
(Continued)

(52) U.S. Cl.
CPC ........ *C23C 16/45544* (2013.01); *C23C 16/50* (2013.01); *C23C 16/52* (2013.01); *H01J 37/32009* (2013.01); *H01J 37/3244* (2013.01)

(58) Field of Classification Search
CPC ... C23C 16/45544; C23C 16/50; C23C 16/52; H01J 37/32009; H01J 37/3244
(Continued)

(56) References Cited

U.S. PATENT DOCUMENTS 4,232,063 A * 11/1980 Rosler ............... C23C 16/45591
117/101
4,315,479 A * 2/1982 Toole .................... C30B 33/005
118/715

(Continued)

OTHER PUBLICATIONS

U.S. Appl. No. 14/805,807, filed Jul. 22, 2015, Leeser et al.

*Primary Examiner* — Rudy Zervigon (57) ABSTRACT

A gas delivery system includes a first valve including an inlet that communicates with a first gas source. A first inlet of a second valve communicates with an outlet of the first valve and a second inlet of the second valve communicates with a second gas source. An inlet of a third valve communicates with a third gas source. A connector includes a first gas channel and a cylinder defining a second gas channel. The cylinder and the first gas channel collectively define a flow channel between an outer surface of the cylinder and an inner surface of the first gas channel. The flow channel communicates with the outlet of the third valve and the first end of the second gas channel. A third gas channel communicates with the second gas channel, with the outlet of the second valve and with a gas distribution device of a processing chamber.

13 Claims, 7 Drawing Sheets (51) Int. Cl.
*C23C 16/52* (2006.01)
*H01J 37/32* (2006.01)

(58) Field of Classification Search
USPC .................................. 118/715; 156/345.33
See application file for complete search history.

(56) References Cited

U.S. PATENT DOCUMENTS

| | | | | |
|---|---|---|---|---|
| 4,751,192 A * | 6/1988 | Hirooka | ............ | H01L 31/03921 |
| | | | | 136/258 |
| 4,761,269 A | 8/1988 | Conger et al. | | |
| 4,793,283 A * | 12/1988 | Sarkozy | .............. | C23C 16/4412 |
| | | | | 118/715 |
| 4,798,166 A * | 1/1989 | Hirooka | .................. | C23C 16/54 |
| | | | | 118/719 |
| 4,822,636 A * | 4/1989 | Saitoh | ................ | G03G 5/08278 |
| | | | | 136/258 |
| 5,273,609 A | 12/1993 | Moslehi | | |
| 5,328,558 A * | 7/1994 | Kawamura | ....... | H01L 21/31116 |
| | | | | 148/DIG. 17 |
| 5,391,232 A * | 2/1995 | Kanai | .................... | C23C 16/455 |
| | | | | 118/715 |
| 5,620,559 A * | 4/1997 | Kikuchi | ............ | H01L 21/31116 |
| | | | | 134/1.1 |
| 5,939,831 A * | 8/1999 | Fong | .................. | C23C 16/4405 |
| | | | | 134/1.1 |
| 5,956,859 A * | 9/1999 | Matsumoto | ....... | H01L 21/67034 |
| | | | | 34/208 |
| 6,167,323 A * | 12/2000 | Komino | ................ | C23C 16/455 |
| | | | | 700/121 |
| 6,190,460 B1 * | 2/2001 | Hwang | ............. | C23C 16/45565 |
| | | | | 118/500 |
| 6,329,297 B1 * | 12/2001 | Balish | ................. | H01J 37/3244 |
| | | | | 134/1.1 |
| 6,511,539 B1 | 1/2003 | Raaijmakers | | |
| 7,017,514 B1 * | 3/2006 | Shepherd, Jr. | ......... | C23C 16/452 |
| | | | | 118/723 ME |
| 7,204,886 B2 * | 4/2007 | Chen | ................. | C23C 16/45502 |
| | | | | 118/715 |
| 7,402,210 B2 * | 7/2008 | Chen | ................. | C23C 16/45502 |
| | | | | 118/715 |
| 7,452,423 B2 * | 11/2008 | Kim | .......................... | C23C 8/06 |
| | | | | 118/715 |
| 7,591,907 B2 * | 9/2009 | Chen | ................. | C23C 16/45502 |
| | | | | 118/715 |
| 7,780,785 B2 | 8/2010 | Chen et al. | | |
| 8,070,879 B2 * | 12/2011 | Chen | ................. | C23C 16/45502 |
| | | | | 118/715 |
| 8,291,857 B2 * | 10/2012 | Lam | ..................... | C23C 16/4412 |
| | | | | 118/715 |
| 8,304,021 B2 * | 11/2012 | Yamamoto | .............. | C23C 16/30 |
| | | | | 118/666 |
| 8,460,468 B2 * | 6/2013 | Piechulla | ................ | C30B 31/10 |
| | | | | 118/715 |
| 8,721,790 B2 * | 5/2014 | Kato | ................... | C23C 16/4412 |
| | | | | 118/715 |
| 9,053,909 B2 * | 6/2015 | Kato | ...................... | C23C 16/452 |
| 9,127,358 B2 * | 9/2015 | Inoue | ................. | C23C 16/4481 |
| 9,163,311 B2 * | 10/2015 | Hasegawa | ......... | C23C 16/45578 |
| 9,449,859 B2 * | 9/2016 | Song | ................. | C23C 16/45565 |
| 2002/0020429 A1 * | 2/2002 | Selbrede | ............. | C23C 16/4405 |
| | | | | 134/1.1 |
| 2004/0266175 A1 * | 12/2004 | Chen | ...................... | C23C 14/022 |
| | | | | 438/629 |
| 2005/0092245 A1 * | 5/2005 | Moon | ............... | C23C 16/45512 |
| | | | | 118/715 |
| 2007/0281106 A1 * | 12/2007 | Lubomirsky | .......... | C23C 16/401 |
| | | | | 427/569 |
| 2008/0292430 A1 * | 11/2008 | Piechulla | ............... | C30B 31/10 |
| | | | | 414/147 |
| 2009/0241834 A1 * | 10/2009 | Kato | ..................... | C23C 16/405 |
| | | | | 118/715 |
| 2009/0250126 A1 | 10/2009 | Koyomogi | | |
| 2010/0055347 A1 * | 3/2010 | Kato | ...................... | C23C 16/452 |
| | | | | 427/569 |
| 2011/0008955 A1 * | 1/2011 | Horii | ....................... | C23C 16/40 |
| | | | | 438/608 |
| 2012/0064698 A1 * | 3/2012 | Olgado | ............ | C23C 16/45565 |
| | | | | 438/478 |
| 2012/0160169 A1 * | 6/2012 | Hasegawa | .................. | B05D 1/34 |
| | | | | 118/725 |
| 2012/0180719 A1 * | 7/2012 | Inoue | .................. | C23C 16/4481 |
| | | | | 118/708 |
| 2012/0180727 A1 * | 7/2012 | Hasegawa | ......... | C23C 16/45578 |
| | | | | 118/730 |
| 2013/0333768 A1 | 12/2013 | Chandrasekharan et al. | | |
| 2014/0182515 A1 * | 7/2014 | Yamazaki | ........... | C23C 16/4481 |
| | | | | 118/722 |
| 2014/0339330 A1 * | 11/2014 | Hong | .................. | C23C 16/4551 |
| | | | | 239/133 |
| 2015/0086722 A1 * | 3/2015 | Gandikota | .......... | C23C 16/4405 |
| | | | | 427/401 |

* cited by examiner

SYSTEMS AND METHODS ENABLING LOW DEFECT PROCESSING VIA CONTROLLED SEPARATION AND DELIVERY OF CHEMICALS DURING ATOMIC LAYER DEPOSITION

CROSS REFERENCE TO RELATED APPLICATIONS

This application claims the benefit of U.S. Provisional Application No. 62/192,844, filed on Jul. 15, 2015. The entire disclosure of the application referenced above is incorporated herein by reference.

This application is related to U.S. Provisional Application No. 62/084,856, filed on Nov. 26, 2014 and U.S. patent application Ser. No. 14/805,807, filed on Jul. 22, 2015, both of which are hereby incorporated by reference in their entirety.

FIELD

The present disclosure relates to substrate processing systems, and more particularly to systems and methods for delivering gases to a processing chamber during substrate processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal during processing. In atomic layer deposition (ALD) or atomic layer etch (ALE) processes, different gas mixtures may be sequentially introduced into the processing chamber and then evacuated. The process is repeated multiple times to deposit film or to etch the substrate. In some ALD and ALE substrate processing systems, radio frequency (RF) plasma may be used during one or both steps to activate chemical reactions.

A first reactant gas may be supplied to the processing chamber during a first step of an ALD process. After a predetermined period, reactants are removed from the processing chamber. During a second step of the ALD process, a second reactant gas may be supplied to the processing chamber. Plasma may or may not be used during the second step to initiate a chemical reaction. After the second step, the reactants are removed from the processing chamber. The first and second steps are typically repeated multiple times to deposit film.

The process time required to deposit the film or to etch the substrate using ALD or ALE largely depends on how quickly the reactant gases can be supplied and evacuated from the processing chamber. Therefore there is an incentive to quickly supply and evacuate the reactant gases to reduce process times. However, if the reactant gases overlap in the gas supply lines, undesirable reactions may occur between the reactant gases, which may cause substrate defects. A sticky reactant gas or an insufficient amount of time between different reactant gases may cause overlap of the reactant gases in the gas lines.

Currently, temporal separation and high flow rates are used. Switching of the gases on and off with high pressures may introduce pressure transients into the gas lines and/or in downstream gas distribution devices, which may cause additional substrate defects.

SUMMARY

A gas delivery system for a substrate processing system includes a first valve including an inlet and an outlet. The inlet of the first valve is in fluid communication with a first gas source. A second valve includes a first inlet, a second inlet and an outlet. The first inlet of the second valve is in fluid communication with the outlet of the first valve and the second inlet is in fluid communication with a second gas source. A third valve includes an inlet and an outlet. The inlet of the third valve is in fluid communication with a third gas source. A connector includes a first gas channel and a cylinder defining a second gas channel having a first end and a second end. The cylinder is at least partially disposed within the first gas channel such that the cylinder and the first gas channel collectively define a flow channel between an outer surface of the cylinder and an inner surface of the first gas channel. The flow channel is in fluid communication with the outlet of the third valve and the first end of the second gas channel. A third gas channel is in fluid communication with the second end of the second gas channel, with the outlet of the second valve and with a gas distribution device of a processing chamber.

In other features, the first gas source includes a purge gas source. The second gas source includes a precursor gas source. A fourth valve includes an inlet and an outlet. The inlet of the fourth valve is in fluid communication with a fourth gas source. The outlet of the fourth valve is in fluid communication with the flow channel. The fourth gas source includes a cleaning gas source. The cleaning gas source includes remote plasma clean (RPC) gas.

In other features, the third gas source includes an oxidizing gas source. The substrate processing system performs atomic layer deposition. A controller is configured to control the first valve, the second valve and the third valve. The controller is configured to supply precursor gas from the second gas source during a first predetermined period using the first valve and the second valve; supply purge gas from the first gas source during a second predetermined period using the first valve and the second valve; and supply an oxidizing gas from the third gas source during a third predetermined period using the third valve.

In other features, the first predetermined period corresponds to a dose stage of an atomic layer deposition (ALD) process. The second predetermined period corresponds to a burst purge stage of the ALD process. The third predetermined period corresponds to a dose purge stage, an RF stage and an RF purge stage of the ALD process.

In other features, a distance between the fourth valve and the connector is between 10" and 40". A distance between the fourth valve and the connector is less than 5".

A method for supplying gas to a substrate processing system includes selectively supplying gas from a first gas source using a first valve; selectively supplying gas from the first gas source or a second gas source using a second valve; selectively supplying gas from a third gas source using a third valve; and providing a connector including: a first gas channel; a cylinder defining a second gas channel having a first end and a second end, wherein the cylinder is at least partially disposed within the first gas channel such that the cylinder and the first gas channel collectively define a flow channel between an outer surface of the cylinder and an inner surface of the first gas channel, wherein the flow channel is in fluid communication with an outlet of the third valve and the first end of the second gas channel; and a third gas channel in fluid communication with the second end of the second gas channel, with an outlet of the second valve and with a gas distribution device of a processing chamber.

In other features, the first gas source includes a purge gas source. The second gas source includes a precursor gas source. The method includes selectively supplying gas from a fourth gas source using a fourth valve having an outlet in fluid communication with the flow channel. The fourth gas source includes a cleaning gas source. The cleaning gas source includes remote plasma clean (RPC) gas.

In other features, the third gas source includes an oxidizing gas source. The substrate processing system performs atomic layer deposition. The method includes controlling the first valve, the second valve and the third valve using a controller.

The controller is configured to supply precursor gas from the second gas source during a first predetermined period using the first valve and the second valve. The controller is configured to supply purge gas from the first gas source during a second predetermined period using the first valve and the second valve. The controller is configured to supply an oxidizing gas from the third gas source during a third predetermined period using the third valve.

In other features, the first predetermined period corresponds to a dose stage of an atomic layer deposition (ALD) process, the second predetermined period corresponds to a burst purge stage of the ALD process, and the third predetermined period corresponds to a dose purge stage, an RF stage and an RF purge stage of the ALD process.

In other features, a distance between the fourth valve and the connector is between 10" and 40". A distance between the fourth valve and the connector is less than 5".

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some examples, the gas delivery systems and methods according to the present disclosure increase separation of a first reactant gas relative to a second reactant gas in gas lines of a substrate processing system to reduce substrate defects. In some examples, continuous flow of purge gas may be supplied to an inlet of a downstream connector where the second gas is introduced.

Spatial separation of the reactant gases in the gas lines of the substrate processing system helps to reduce substrate defects. The spatial separation overcomes problems associated with temporal-only separation. By providing continuous purge gas flow to the inlet of the downstream connector and situating a valve supplying the second reactant gas remotely relative to the first reactant gas, pressure transients can also be managed. A risk of reaction stills exists if there is an insufficient amount of time allocated for spatial separation between the first reactant gas and the second reactant gas. However, the location where the gas reactants are mixed and the pressure at the mixing location can be controlled and the reactions can be managed.

Spatial separation increases robustness of the gas delivery system by allowing for margin on process development with respect to purge times. The use of physical separation can be combined with temporal separation that is controlled by valve timing. The combination can help optimize process chamber purging separate from gas line protection.

Figure 1:
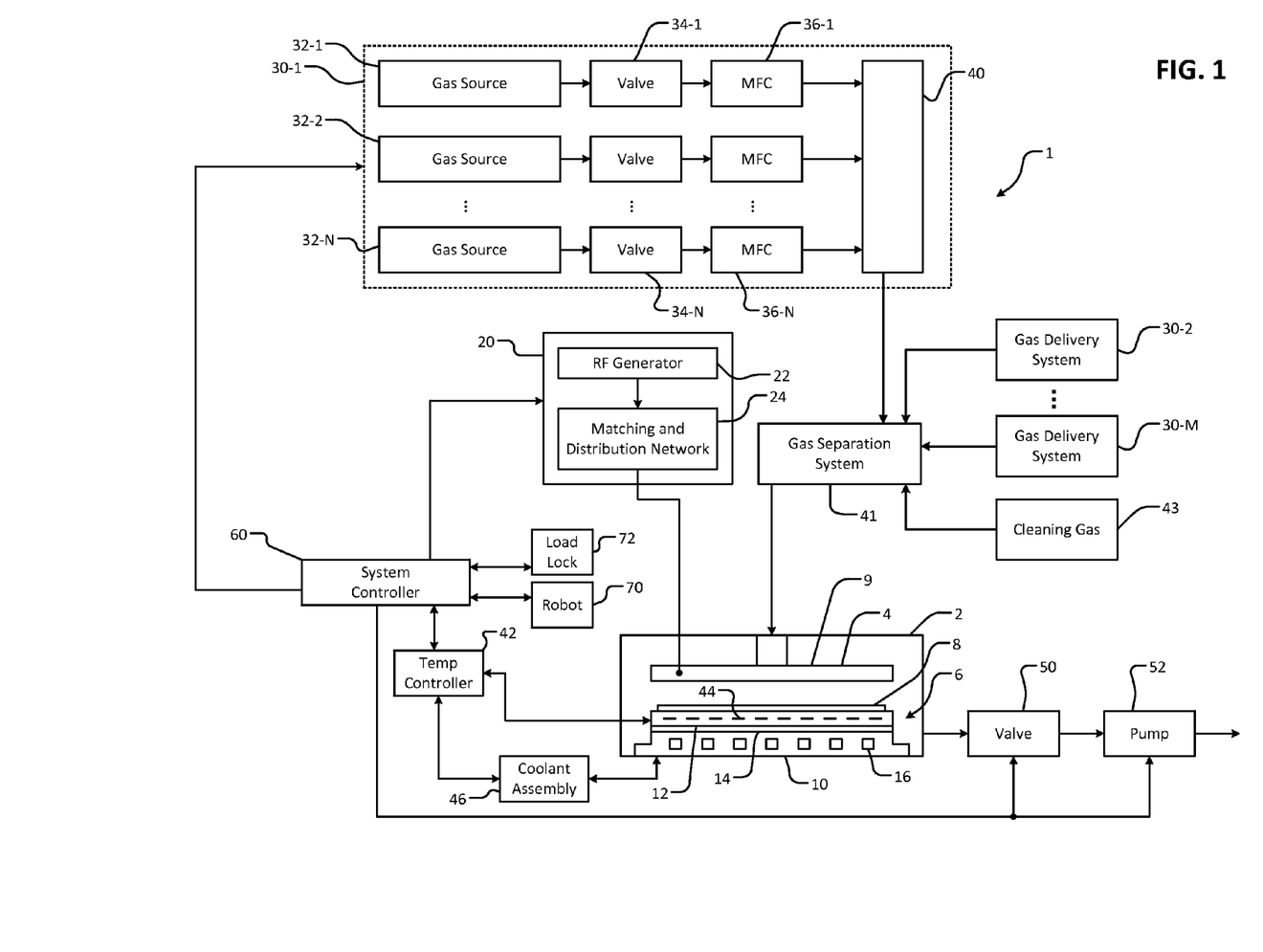
FIG. 1 is a functional block diagram for a substrate processing system according to the present disclosure.

Referring now to FIG. 1, an example substrate processing system 1 is shown. While the foregoing example will be described in the context of plasma enhanced atomic layer deposition (PEALD), the present disclosure may be applied to other substrate processing systems such as chemical vapor deposition (CVD), PECVD, ALE, ALD, and PEALE. The substrate processing system 1 includes a processing chamber 2 that encloses other components of the substrate processing system 1 and contains the RF plasma (if used). The substrate processing system 1 includes an upper electrode 4 and an electrostatic chuck (ESC) 6 or other substrate support. During operation, a substrate 8 is arranged on the ESC 6.

For example only, the upper electrode 4 may include a gas distribution device 9 such as a showerhead that introduces and distributes process gases. The gas distribution device 9 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 4 may include a conducting plate and the process gases may be introduced in another manner.

The ESC 6 includes a conductive baseplate 10 that acts as a lower electrode. The conductive baseplate 10 supports a heating plate 12, which may correspond to a ceramic multi-zone heating plate. A thermal resistance layer 14 may be arranged between the heating plate 12 and the baseplate 10. The baseplate 10 may include one or more coolant channels 16 for flowing coolant through the baseplate 10.

An RF generating system 20 generates and outputs an RF voltage to one of the upper electrode 4 and the lower electrode (e.g., the baseplate 10 of the ESC 6). The other one of the upper electrode 4 and the baseplate 10 may be DC grounded, AC grounded or floating. For example only, the RF generating system 20 may include an RF generator 22 that generates RF power that is fed by a matching and distribution network 24 to the upper electrode 4 or the baseplate 10. In other examples, the plasma may be generated inductively or remotely.

One or more gas delivery systems 30-1, 30-2, ..., and 30-M (collectively gas delivery systems 30) include one or more gas sources 32-1, 32-2, ..., and 32-N (collectively gas sources 32), where M and N are integers greater than zero. The gas sources 32 are connected by valves 34-1, 34-2, ..., and 34-N (collectively valves 34) and mass flow controllers 36-1, 36-2, ..., and 36-N (collectively mass flow controllers 36) to a manifold 40. An output of the manifold 40 is fed to a gas separation system 41. While a specific gas delivery system 30-1 is shown, gas may be delivered using any suitable gas delivery systems. One or more additional gas delivery systems 30-2, ..., and 30-M fluidly communicate with the gas separation system 41. A cleaning gas source 43 such as remote plasma clean (RPC) gas may also fluidly communicate with the gas separation system 41.

A temperature controller 42 may be connected to a plurality of thermal control elements (TCEs) 44 arranged in the heating plate 12. The temperature controller 42 may be used to control the plurality of TCEs 44 to control a temperature of the ESC 6 and the substrate 8. The temperature controller 42 may communicate with a coolant assembly 46 to control coolant flow through the channels 16. For example, the coolant assembly 46 may include a coolant pump and reservoir. The temperature controller 42 operates the coolant assembly 46 to selectively flow the coolant through the channels 16 to cool the ESC 6.

A valve 50 and pump 52 may be used to evacuate reactants from the processing chamber 2. A system controller 60 may be used to control components of the substrate processing system 1. A robot 70 may be used to deliver substrates onto, and remove substrates from, the ESC 6. For example, the robot 70 may transfer substrates between the ESC 6 and a load lock 72.

Figure 2:
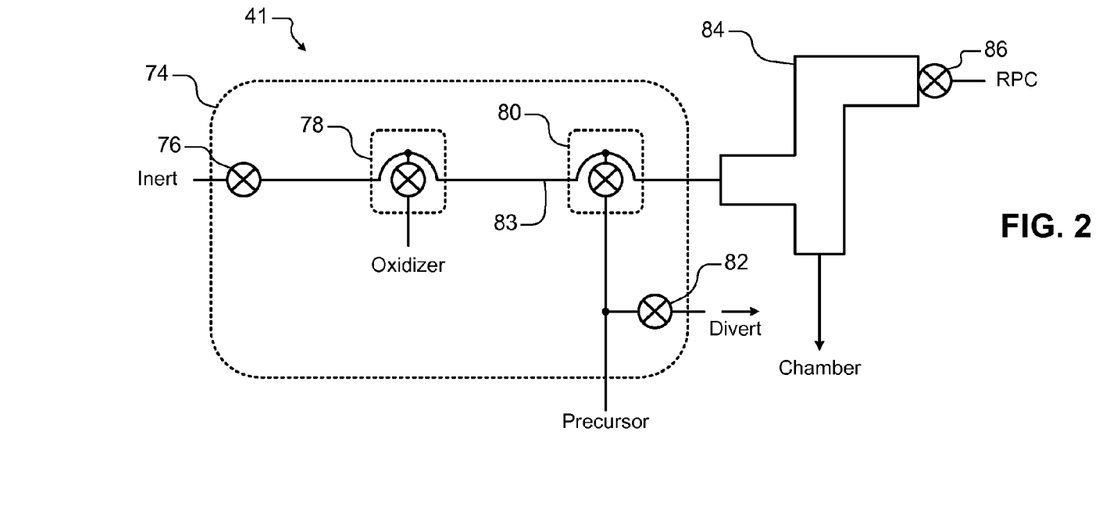
FIG. 2 is a schematic diagram of an example of a gas delivery system.

Referring now to FIG. 2, an example of the gas separation system 41 is shown to include a valve assembly 74 including a plurality of valves 76, 78, 80 and 82 connected by gas lines 83. An inlet of the valve 76 is connected to a purge gas source and an outlet of the valve 76 is connected to an inlet of the valve 78. Another inlet of the valve 78 is connected to a reactant gas such as an oxidizing gas source. An outlet of the valve 78 is connected to an inlet of the valve 80. Another inlet of the valve 80 is connected to a reactant gas such as a precursor gas source.

An outlet of the valve 80 is connected to an elbow connector 84, which is connected to an outlet of a valve 86 and to the processing chamber. An inlet of the valve 86 is connected to a cleaning gas such as remote plasma clean (RPC) gas source. The valve 82 has an inlet connected to the precursor gas and an outlet.

During operation, the precursor gas may optionally be diverted using the valves 80 (connection from precursor gas inlet to outlet is closed) and 82 (opened) for a predetermined period. After diversion, the precursor gas is supplied to the processing chamber for a predetermined period using valves 80 (connection from precursor gas inlet to outlet is open) and 82 (closed) and then the supply of precursor gas is terminated. Purge gas is supplied to the processing chamber using valves 76, 78 and 80 and then terminated. Oxidizing gas is supplied to the processing chamber using valves 78 and 80. As can be appreciated, the precursor gas is supplied to the processing chamber using some of the same gas lines 83 and valves as the oxidizing gas.

Figure 3:
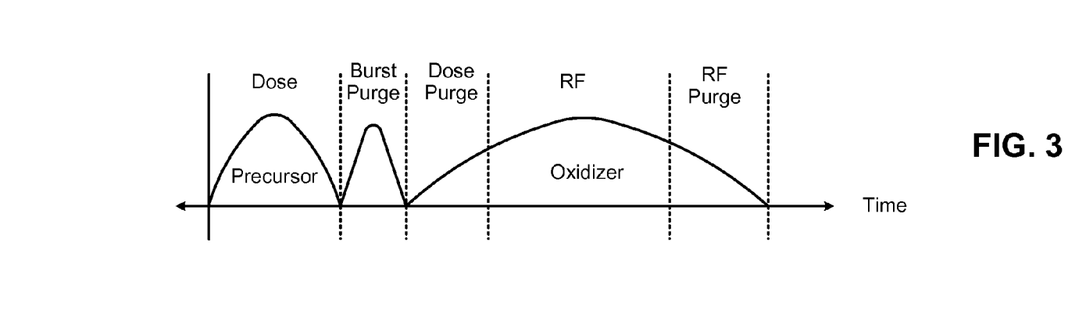
FIG. 3 is a timing diagram for an example atomic layer deposition process.

Referring now to FIG. 3, operation of the valves of FIG. 2 is shown. Prior to a dose stage, purge gas may initially be supplied and diverted using the valves 80 and 82. After a predetermined period, the valves 80 and 82 are arranged to supply precursor gas to the processing chamber via the elbow connector 84 (dose stage). At the end of the dose stage, the valve 80 stops supplying precursor gas and is positioned to supply purge gas. During a burst purge stage, the purge gas is supplied via valves 76, 78, 80 and the elbow connector 84 to the processing chamber. At the end of the burst purge stage, the valve 76 is closed. An oxidizing gas is supplied to the processing chamber during dose purge, RF and RF purge stages using the valves 78, 80 and the elbow connector 84.

The precursor gas and oxidizing gas are both supplied using the same group of valves and gas lines but are separated temporally. Temporal separation relies on large flow rates and sufficient time to fully clean out gas lines 83 between precursor gas flow and oxidizing gas flow. Either a sticky precursor or an insufficient amount of time allotted may result in defect formation due to reactions in the gas channels. In addition, high flow rates and switching between oxidizer, purge gas and precursor gas can introduce pressure transients in the gas channels and gas distribution devices.

Figure 4:
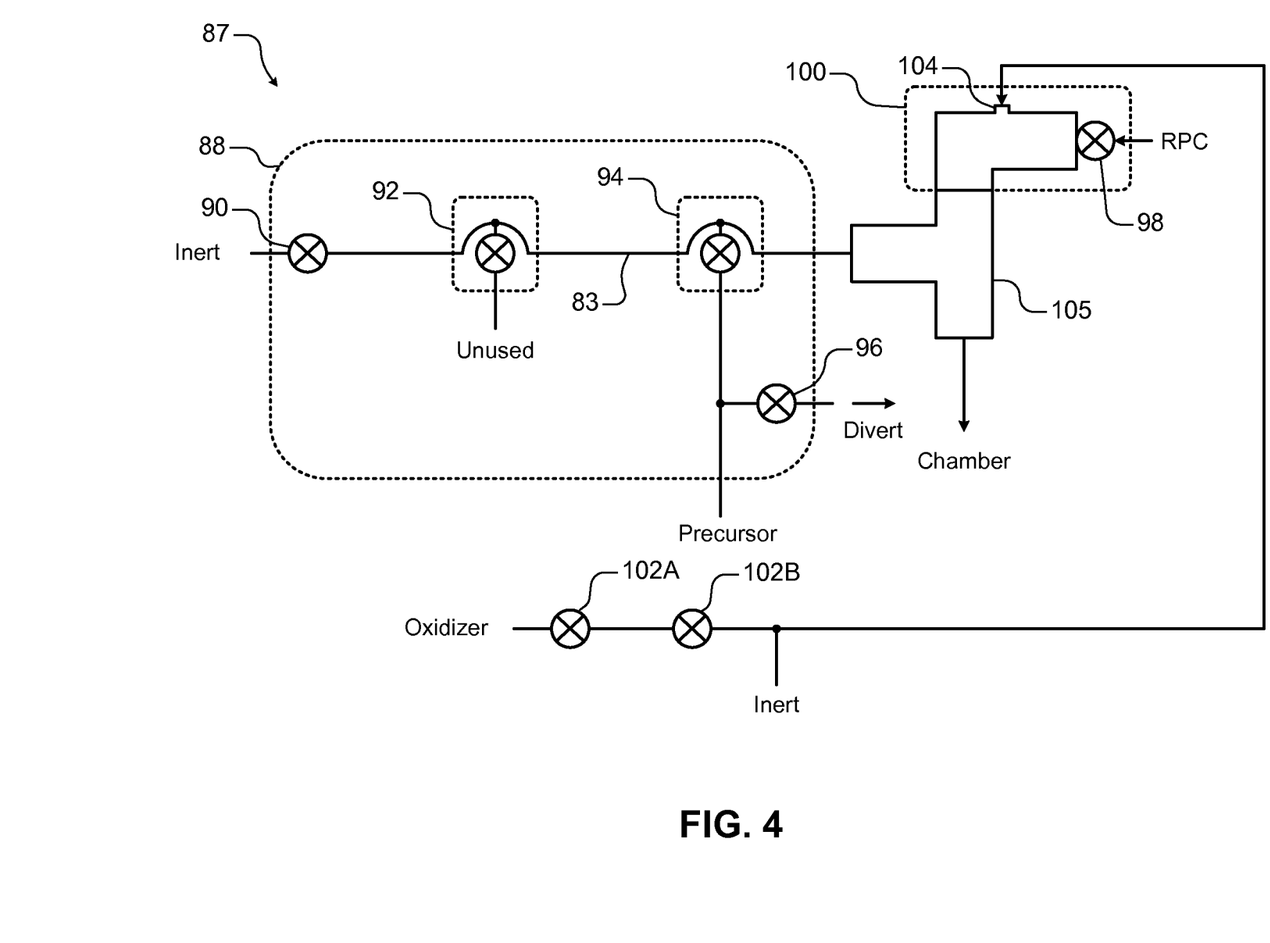
FIG. 4 is a schematic diagram of another example gas delivery system according to the present disclosure.

Referring now to FIG. 4, a gas separation system 87 includes a valve assembly 88 including a plurality of valves 90, 92, 94, and 96 and gas lines 83. An inlet of the valve 90 is connected to a purge gas source and an outlet of the valve 90 is connected to an inlet of the valve 92. In some examples, the purge gas includes helium, argon or another inert gas. An outlet of the valve 92 is connected to an inlet of the valve 94. Another inlet of the valve 94 is connected to a reactant gas such as precursor gas.

An outlet of the valve 94 is connected to an elbow connector 100, which is connected to an outlet of a valve 98 and to the processing chamber. An inlet of the valve 98 is connected to a process gas such as a remote plasma clean (RPC) source. The valve 96 has an inlet connected to the precursor gas and an outlet.

One or more valves 102A and 102B (collectively valve 102) are used to supply a reactant gas such as an oxidizing gas to an inlet 104 of the elbow connector 100. In some examples, the valve 102 is arranged a distance between 10" and 40" from the inlet of the elbow connector 100.

Purge gas may also be continuously supplied to the inlet 104 of the elbow connector 100 or selectively supplied to the inlet 104 (during supply of oxidizing gas or at times other than during supply of oxidizing gas). A "T"-shaped fluid connector 105 has a first leg fluidly connected to the elbow connector 100, a second leg fluidly connected to the outlet of the valve 94 and a third leg fluidly connected to the processing chamber. In some examples, the "T"-shaped fluid connector 105 may be made of ceramic.

Figure 5:
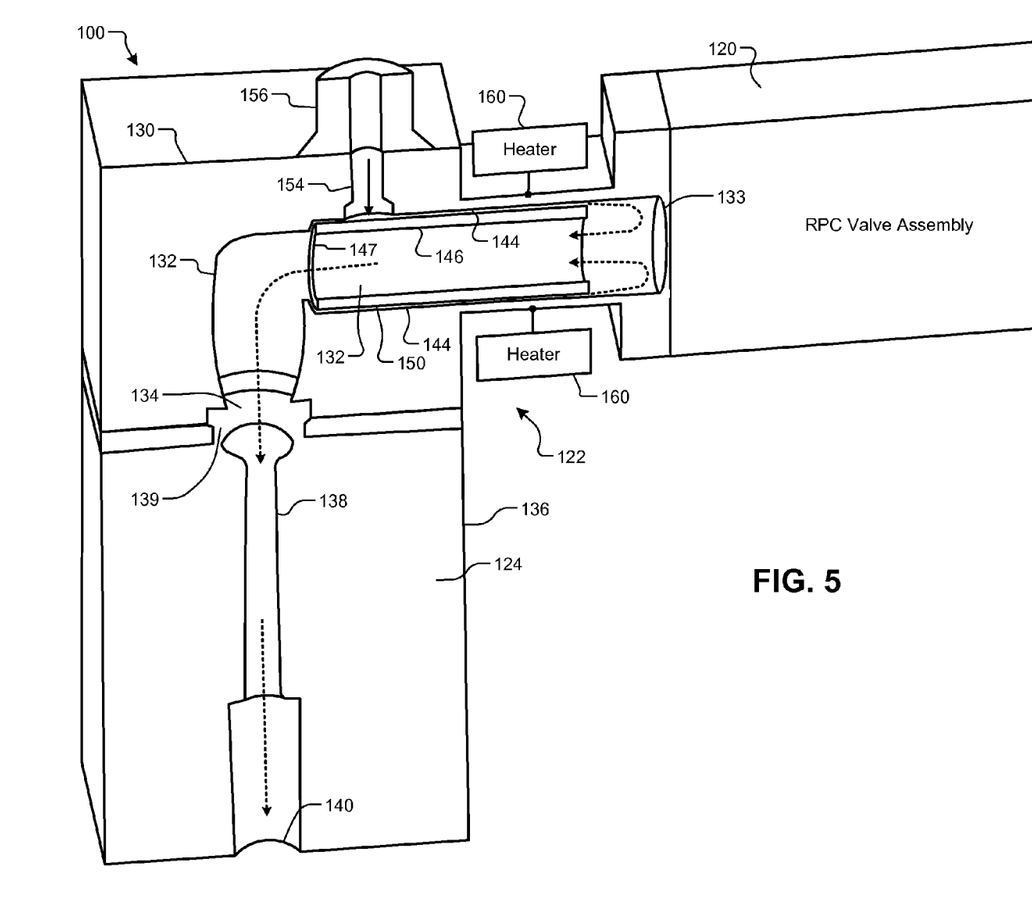
FIG. 5 is a partial, perspective cross-sectional view of a connector according to the present disclosure.

Referring now to FIG. 5, an example of the elbow connector 100 includes a first connector 122 connected to a valve assembly 120 and second connector 124. Additional details relating to the elbow connector 100 may be found in commonly-assigned U.S. Provisional Application No. 62/084,856, filed on Nov. 26, 2014 and entitled "REMOTE PLASMA CLEAN ELBOW CONNECTOR WITH PURGING TO REDUCE ON-WAFER PARTICLES" and U.S. patent application Ser. No. 14/805,807, filed on Jul. 22, 2015 and entitled "VALVE MANIFOLD DEADLEG ELIMINA- TION VIA REENTRANT FLOW PATH", both of which are hereby incorporated by reference in their entirety.

The first connector 122 includes a first body 130 defining a first gas channel 132 including an inlet 133 and an outlet 134. The second connector 124 includes a second body 136 defining a second gas channel 138 including an inlet 139 and an outlet 140. The outlet 134 of the first gas channel 132 is connected to the inlet 139 of the second gas channel 138. In some examples, first gas channel 132 is generally "L"-shaped or elbow-shaped.

The first connector 122 includes an annular channel 144 that is arranged around a portion of the first gas channel 132 adjacent to the inlet 133 of the first connector 122. The annular channel 144 supplies gas to an area near the inlet 133. In some examples, a cylinder 146 may be inserted inside of the first gas channel 132 adjacent to the inlet 133 of the first connector 122 to define the annular channel 144. One end 147 of the cylinder 146 abuts an inner surface of the first gas channel 132 in a position that is spaced from the inlet 133. A cavity 150 between the body 130 and a radially outer surface of the cylinder 146 defines the annular channel 144.

The body 130 further defines a third gas channel 154 that is connected to the cavity 150. A fitting or valve 156 may be used to connect the third gas channel 154 to a gas source. Gas is supplied to the third gas channel 154 and the annular channel 144. The gas flows through the annular channel 144 into the area near the inlet 133. The gas flows through the first gas channel 132 to the second gas channel 138. The gas may be supplied during remote plasma cleaning (while RPC gas is supplied by the RPC valve). In some examples, the gas is supplied during dosing using precursor gas and/or during supply of oxidizing gas as well.

In some examples, a heater 160 may be used to maintain the temperature in the area in the vicinity of the annular channel 144 at a predetermined minimum temperature. More particularly, the heater 160 may be connected to the body 130 and may be used to heat the body (at least the portion including the dead-leg volume) to a temperature above a condensation temperature of the gas. In some examples, the temperature is maintained at a predetermined temperature above approximately ~65° C., although the temperature will vary depending on the type of gas that is used and its condensation temperature.

Figure 6:
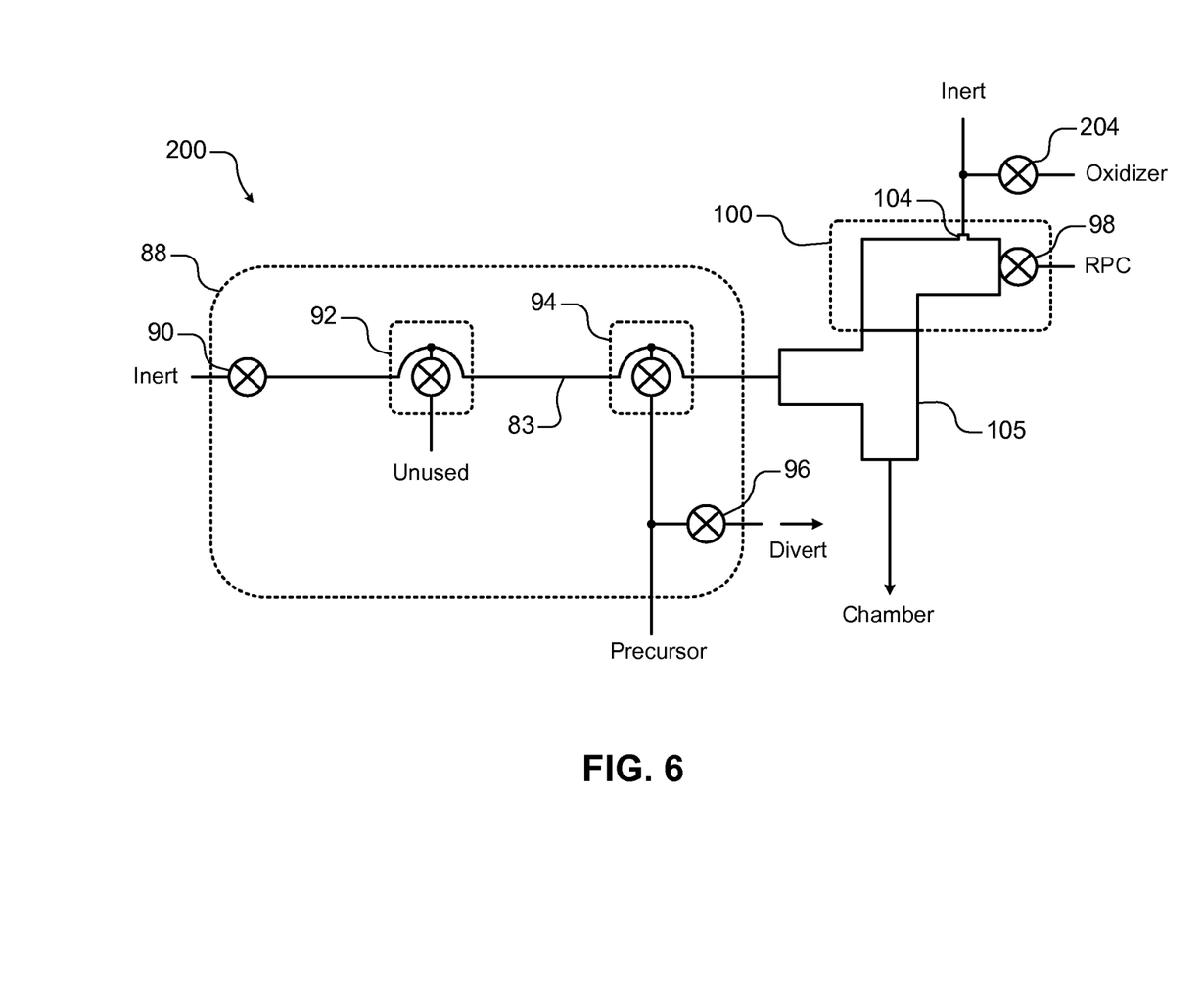
FIG. 6 is a schematic diagram of yet another example gas delivery system according to the present disclosure.

Referring now to FIG. 6, another gas separation system 200 includes the valve assembly 88 described above. A valve 204 is arranged closer to the inlet 104 of the elbow connector 100. In some examples, the valve 204 is arranged a distance less than 10" from the inlet of the elbow connector 100. In other examples, the distance is less than or equal to 5", 2.5" or 1".

Figure 7:
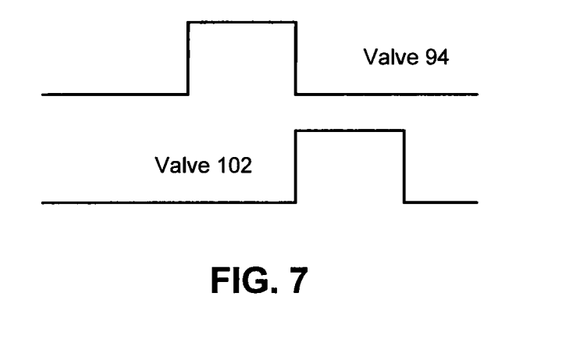
FIG. 7 illustrates timing of valves for an idealized gas delivery system.
Figure 8:
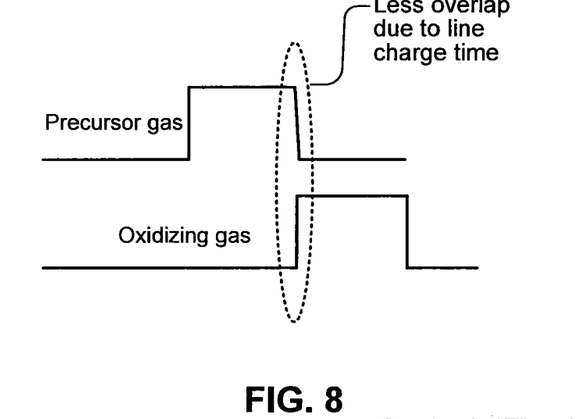
FIG. 8 illustrates timing of valves for the gas delivery system of FIG. 4 according to the present disclosure.
Figure 9:
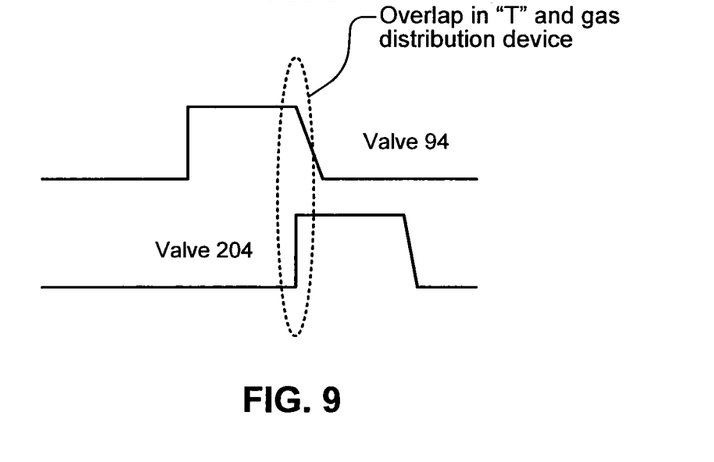
FIG. 9 illustrates timing of valves for the gas delivery system of FIG. 6 according to the present disclosure.

Referring now to FIGS. 7-9, various timing diagrams for valve sequencing and timing are shown. In FIG. 7, idealized valve sequencing and timing is shown. Ideally, the precursor gas flow ends at the same time as the oxidant gas flow begins and there is no overlap. In FIG. 8, operation of the valves in FIG. 4 is shown. There is less overlap than that experienced in FIG. 2 between precursor and oxidizer due to line charge time. In FIG. 9, operation of the valves in FIG. 6 is shown. There may be some overlap in the ""T"-shaped fluid connector 105.

Figure 10:
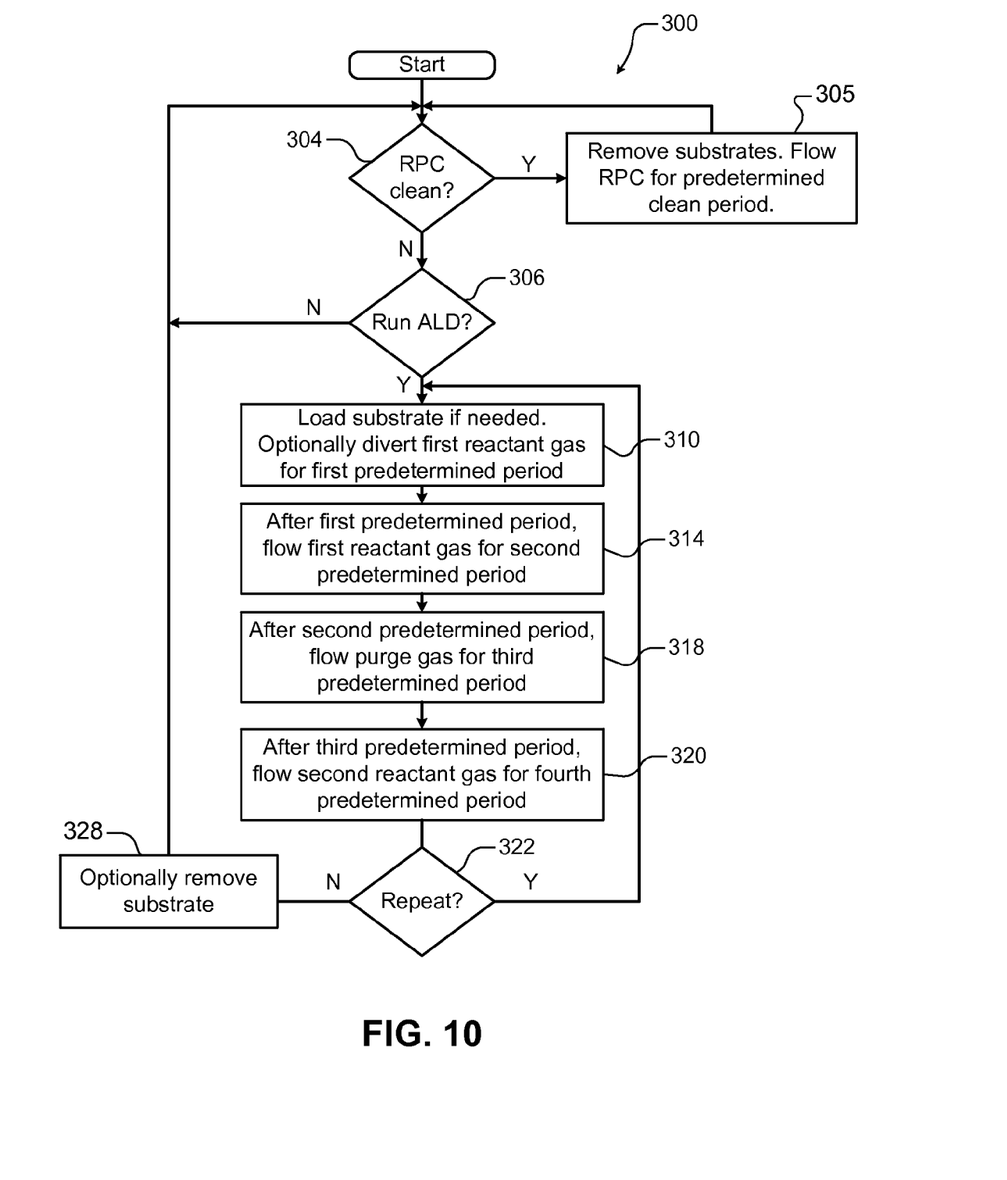
FIG. 10 is a flowchart illustrating an example of a method for supplying gas according to the present disclosure.

Referring now to FIG. 10, an example of a method 300 for operating the gas delivery system described above is shown. At 304, the method determines whether cleaning using remote plasma clean (RPC) gas or another cleaning gas should be performed. If true, the substrates are removed from the processing chamber and cleaning gas or RPC gas is supplied for a predetermined clean period.

If 304 is false, control determines whether an ALD process needs to be performed. If 306 is true, substrates are loaded into the processing chamber at 310. Additionally, a first reactant gas such as precursor gas is optionally supplied and diverted for a first predetermined period at 310. At 314, after the first predetermined period, the first reactant gas such as a precursor gas is supplied to the processing chamber for a second predetermined period.

After the second predetermined period, purge gas such as an inert gas is supplied for a third predetermined period at 318. After the third predetermined period, a second reactant gas such as an oxidizing gas is supplied for a fourth predetermined period at 320. After the fourth predetermined period, control determines whether to repeat the ALD process at 322. If 322 is true, control returns to 310. Otherwise, control continues with 328, optionally removes the substrate from the processing chamber and then returns to 304.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas delivery system for a substrate processing system, comprising:
    a first valve including an inlet and an outlet, wherein the inlet is in fluid communication with a first gas source;
    a second valve including a first inlet, a second inlet and an outlet, wherein the first inlet is in fluid communication with the outlet of the first valve and the second inlet is in fluid communication with a second gas source;
    a third valve including an inlet and an outlet, wherein the inlet is in fluid communication with a third gas source; and
    a connector comprising:
        a first gas channel;
        a cylinder defining a second gas channel having a first end and a second end,
        wherein the cylinder is at least partially disposed within the first gas channel such that the cylinder and the first gas channel collectively define a flow channel between an outer surface of the cylinder and an inner surface of the first gas channel,
        wherein the flow channel is in fluid communication with the outlet of the third valve and the first end of the second gas channel; and
        a third gas channel in fluid communication with the second end of the second gas channel, with the outlet of the second valve and with a gas distribution device of a processing chamber,
        wherein the first end of the second gas channel is in fluid communication with an inlet of the first gas channel such that gas provided to an inlet in the second end of the second gas channel flows through the second channel from the second end to the first end, into the inlet of the first gas channel, and through the first gas channel into the third gas channel.

2. The gas delivery system of claim 1, wherein the first gas source includes a purge gas source.

3. The gas delivery system of claim 1, wherein the second gas source includes a precursor gas source.

4. The gas delivery system of claim 1, further comprising a fourth valve including an inlet and an outlet, wherein the inlet is in fluid communication with a fourth gas source, and wherein the outlet is in fluid communication with the flow channel.

5. The gas delivery system of claim 4, wherein the fourth gas source includes a cleaning gas source.

6. The gas delivery system of claim 5, wherein the cleaning gas source includes remote plasma clean (RPC) gas.

7. The gas delivery system of claim 1, wherein the third gas source includes an oxidizing gas source.

8. The gas delivery system of claim 1, wherein the substrate processing system performs atomic layer deposition.

9. The gas delivery system of claim 1, further comprising a controller configured to control the first valve, the second valve and the third valve.

10. The gas delivery system of claim 9, wherein the controller is configured to:
   supply precursor gas from the second gas source during a first predetermined period using the first valve and the second valve;
   supply purge gas from the first gas source during a second predetermined period using the first valve and the second valve; and
   supply an oxidizing gas from the third gas source during a third predetermined period using the third valve.

11. The gas delivery system of claim 10, wherein:
   the first predetermined period corresponds to a dose stage of an atomic layer deposition (ALD) process;
   the second predetermined period corresponds to a burst purge stage of the ALD process; and
   the third predetermined period corresponds to a dose purge stage, a radio frequency (RF) stage and an RF purge stage of the ALD process.

12. The gas delivery system of claim 4, wherein a distance between the fourth valve and the connector is between 10" and 40".

13. The gas delivery system of claim 4, wherein a distance between the fourth valve and the connector is less than 5".

* * * * *